(12) United States Patent
Nyshadham et al.

(10) Patent No.: US 12,164,324 B2
(45) Date of Patent: Dec. 10, 2024

(54) LOW NOISE BANDGAP REFERENCE ARCHITECTURE

(71) Applicant: Texas Instruments Incorporated, Dallas, TX (US)

(72) Inventors: Sanjeev Praphulla Chandra Nyshadham, Bangalore (IN); Subrato Roy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/419,784

(22) Filed: Jan. 23, 2024

(65) Prior Publication Data

US 2024/0192718 A1    Jun. 13, 2024

Related U.S. Application Data

(63) Continuation of application No. 17/850,600, filed on Jun. 27, 2022, now Pat. No. 11,914,412.

(30) Foreign Application Priority Data

Jun. 25, 2021 (IN) .............................. 202141028637

(51) Int. Cl.
| | |
|---|---|
| G05F 3/26 | (2006.01) |
| G05F 1/46 | (2006.01) |
| G05F 1/565 | (2006.01) |
| H03F 3/345 | (2006.01) |

(52) U.S. Cl.
CPC .............. *G05F 3/267* (2013.01); *G05F 1/468* (2013.01); *G05F 1/565* (2013.01); *H03F 3/345* (2013.01)

(58) Field of Classification Search
CPC .......... G05F 1/468; G05F 1/565; G05F 3/267; H03F 3/345
See application file for complete search history.

(56) References Cited

U.S. PATENT DOCUMENTS

| | | | | |
|---|---|---|---|---|
| 2009/0237150 A1* | 9/2009 | Tsai | ........................ | H03F 3/345 327/539 |
| 2017/0147028 A1* | 5/2017 | Arnold | ...................... | G05F 3/30 |

* cited by examiner

*Primary Examiner* — Jue Zhang
*Assistant Examiner* — Lakaisha Jackson
(74) *Attorney, Agent, or Firm* — Charles F. Koch; Frank D. Cimino

(57) ABSTRACT

In described examples, a circuit includes a first current mirror circuit. The first current mirror circuit is coupled to a power input terminal. A first stage is coupled to the first current mirror circuit, and a second stage is coupled to the first stage and to the first current mirror circuit. An amplifier is coupled to the first and second stages. The amplifier has first and second input terminals. The first input terminal is coupled to the first stage, and the second input terminal is coupled to the second stage. A second current mirror circuit is coupled to the first stage, the second stage and the amplifier.

20 Claims, 6 Drawing Sheets

LOW NOISE BANDGAP REFERENCE ARCHITECTURE

CROSS-REFERENCE TO RELATED APPLICATION

This application is a continuation of application Ser. No. 17/850,600, filed Jun. 27, 2022, which claims priority to India Provisional Patent Application No. 202141028637 filed Jun. 25, 2021, both of which are hereby incorporated by reference in their entirety.

TECHNICAL FIELD

This description relates generally to bandgap reference circuits, and more particularly to bandgap reference circuits that are capable of operating over a wide range of supply voltages with low quiescent current.

BACKGROUND

Many applications of integrated circuits are embodied within a highly integrated system such as a system-on-chip (SoC). In some of these applications (such as automotive applications), the SoCs work from low supply voltages and consume relatively low amounts of power. The automotive applications incorporate multiple functions that are always in "on" domain. Almost all of these SoCs have a bandgap reference circuit that provides a stable voltage reference, which is generally termed as a bandgap voltage, over a range of temperatures and process variations. Because bandgap reference circuits provide voltage references for associated circuitry, bandgap reference circuits are generally specified to provide the "turn on" as early as possible and stay on as long as possible when a supply voltage exists. Portable battery-powered applications can specify a bandgap reference circuit that operates at low voltage and consumes low power.

SUMMARY

In described examples, a circuit includes a first current mirror circuit. The first current mirror circuit is coupled to a power input terminal. A first stage is coupled to the first current mirror circuit, and a second stage is coupled to the first stage and to the first current mirror circuit. An amplifier is coupled to the first and second stages. The amplifier has first and second input terminals. The first input terminal is coupled to the first stage, and the second input terminal is coupled to the second stage. A second current mirror circuit is coupled to the first stage, the second stage and the amplifier.

DETAILED DESCRIPTION OF EXAMPLE EMBODIMENTS

Figure 1:
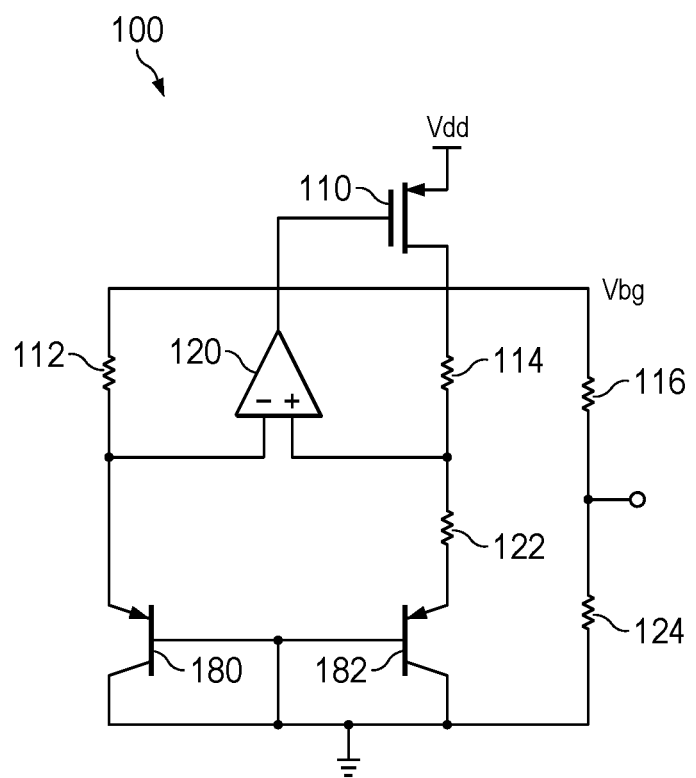
FIG. 1 is a schematic of a circuit.

FIG. 1 is a schematic of a circuit 100. The circuit 100 includes a p-channel field effect transistor (PFET) 110, resistors 112, 114, 116, 122 and 124, an amplifier 120, a first bipolar transistor 180 and a second bipolar transistor 182. A source of the PFET 110 is coupled to a power input terminal Vdd. The power input terminal Vdd receives a power supply voltage. A gate of the PFET 110 is coupled to the amplifier 120. A drain of the PFET 110 is coupled to the resistor 112 and to the resistor 114.

The amplifier 120 includes a first input terminal, a second input terminal and an output terminal. The output terminal of the amplifier 120 is coupled to the gate of the PFET 110. The resistor 114 is coupled to the first input terminal of the amplifier 120. The resistor 112 is coupled to the second input terminal of the amplifier 120. The resistor 122 is coupled between the resistor 114 and the second bipolar transistor 182.

An emitter of the first bipolar transistor 180 is coupled to the resistor 112 and to the second input terminal of the amplifier 120. A collector of the first bipolar transistor 180 is coupled to a ground terminal. An emitter of the second bipolar transistor 182 is coupled to the resistor 122. A collector of the second bipolar transistor 182 is coupled to the ground terminal. A base of the second bipolar transistor 182 is coupled to a base of the first bipolar transistor 180 and to the ground terminal. The resistors 116 and 124 form a voltage divider network. The resistor 116 is coupled between the drain of the PFET 110 and the resistor 124. The resistor 124 is coupled between the resistor 116 and the ground terminal.

In operation, the circuit 100 operates as a bandgap reference circuit that generates a bandgap voltage Vbg. The circuit 100 generates a constant voltage by adding an amplified difference between the base-to-emitter voltage (VBE) of the first bipolar transistor 180 and base-to-emitter voltage (VBE) of the second bipolar transistor 182 (e.g., "m*ΔVBE") to the VBE generated by the first bipolar transistor 180, in order to generate a temperature-compensated bandgap voltage (Vbg). The Vbg signal is temperature-compensated because the temperature coefficients of m*ΔVBE are ideally exactly equal and opposite to the temperature coefficients associated with VBE of the first bipolar transistor 180.

A current through a drain of the PFET 110 is expressed as:

$$Id = \frac{Vbg}{R116 + R124} + \frac{\Delta VBE}{R122}\left(1 + \frac{R114}{R112}\right) \quad (1)$$

where ΔVBE is a difference between base-to-emitter voltage (VBE) of the first bipolar transistor 180 and VBE of the second bipolar transistor 182. As illustrated in equation (1), Id is dependent on temperature-compensated Vbg and temperature-dependent ΔVBE, so the circuit 100 is not well-suited for generating accurate bandgap reference current or voltage. Also, an offset voltage associated with the amplifier 120 causes inaccuracies in the bandgap voltage.

Also, during startup of the circuit 100, all the current from the PFET 110 will flow through the resistor 116 over a certain range of PFET gate voltages. For at least this reason, the circuit 100 has multiple operating points (e.g., more than two operating points) and might not reach a correct operating point without additional control circuitry. An operating point is a point (e.g., for a given set of selected values of components of a circuit) in which a stable bandgap voltage Vbg is maintained by the circuit 100. A valid (e.g., correct) operating point is a point at which the circuit 100 operates in accordance with its specified function. Accordingly, an operating point can be valid or invalid depending on context.

A second example of a bandgap reference circuit is a Banba bandgap architecture (not shown in the drawings). The Banba bandgap architecture operates in a current (e.g., flow) domain (as compared to the voltage domain in which the circuit 100 operates). The Banba bandgap architecture generates a constant voltage by adding the delta VBE dependent current to a correct proportion of the VBE dependent current and passing it through a similar type resistor by which VBE and deltaVBE current has been generated.

However, the Banba bandgap architecture operates with higher inaccuracies that result from the current mirroring used to generate the bandgap voltage. Also, an offset voltage associated with the amplifier used in the Banba bandgap architecture causes inaccuracies in the bandgap voltage. Further, such inaccuracies progressively become even greater as increasingly deeper sub-micron processes are used. The Banba bandgap architecture also has multiple operating points and might not reach a correct operating point without additional control circuitry.

Figure 2:
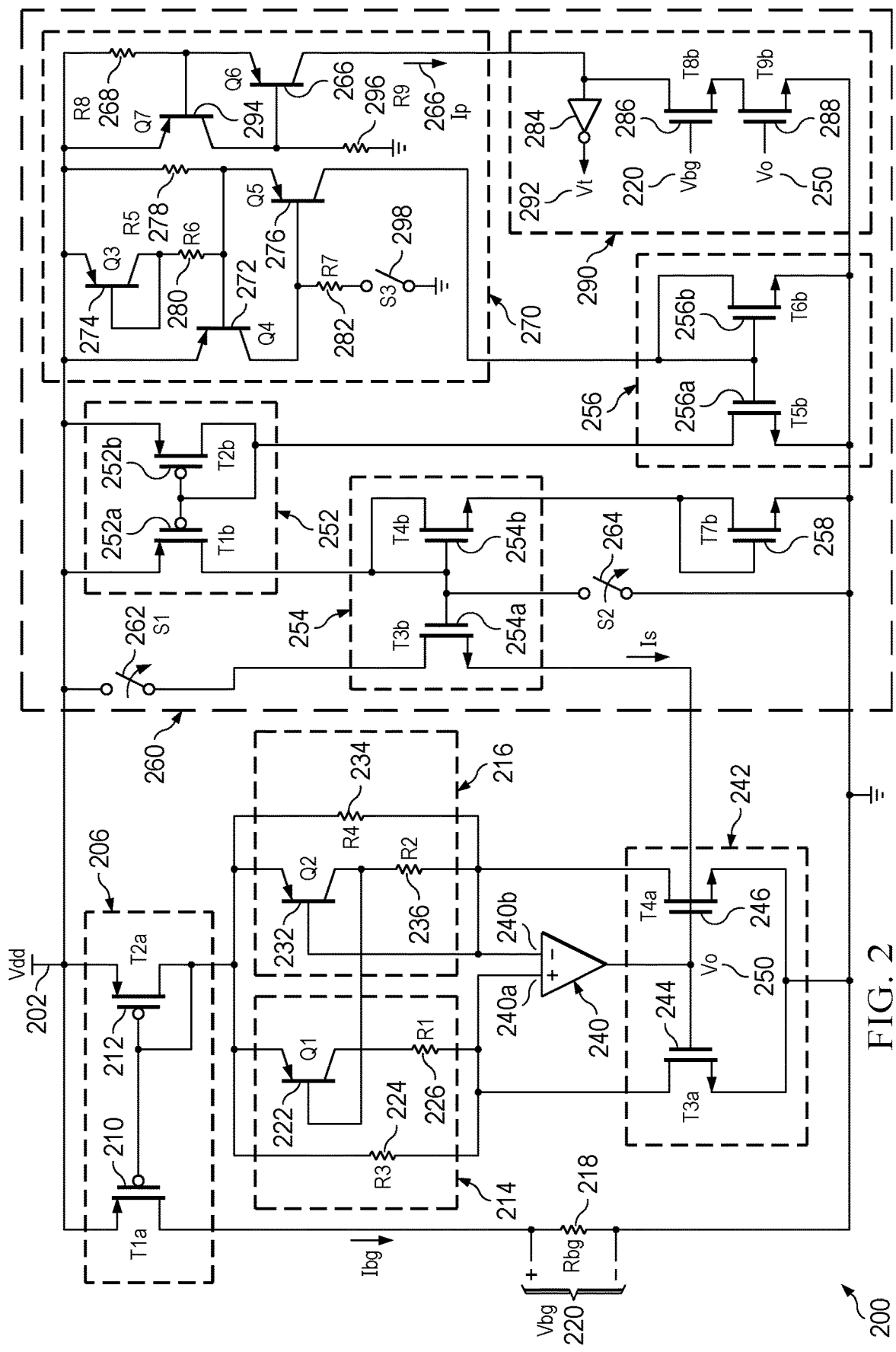
FIG. 2 is a schematic of a circuit, according to an embodiment.

FIG. 2 is a schematic of a circuit 200, according to an embodiment. The circuit 200 includes a first current mirror circuit 206, a first stage 214, a second stage 216, an amplifier 240, a second current mirror circuit 242 and a start-up circuit 260. The first current mirror circuit 206 is coupled to a power input terminal Vdd 202. In one example, the power input terminal Vdd 202 receives a power supply voltage. The first current mirror circuit 206 includes a first alpha transistor T1a 210 and a second alpha transistor T2a 212. In one example, the second alpha transistor T2a 212 is a diode-connected PFET.

A source of the first alpha transistor T1a 210 is coupled to the power input terminal Vdd 202. A drain of the first alpha transistor T1a 210 is coupled to a bandgap resistor Rbg 218. A source of the second alpha transistor T2a 212 is coupled to the power input terminal Vdd 202. A drain of the second alpha transistor T2a 212 is coupled to the gates of the second alpha transistor T2a 212 and the first alpha transistor T1a 210.

The first stage 214 is coupled to the first current mirror circuit 206. The first stage 214 includes a first bipolar transistor Q1 222, a first resistor R1 226 and a third resistor R3 224. An emitter of the first bipolar transistor Q1 222 is coupled to the drain of the second alpha transistor T2a 212 in the first current mirror circuit 206. A base of the first bipolar transistor Q1 222 is coupled to the second stage 216. A first end of the first resistor R1 226 is coupled to a collector of the first bipolar transistor Q1 222, and a second end of the first resistor R1 226 is coupled to the amplifier 240. A first end of the third resistor R3 224 is coupled to the drain of the second alpha transistor T2a 212, and a second end of the third resistor R3 224 is coupled to the amplifier 240.

The second stage 216 is coupled to the first stage 214 and to the first current mirror circuit 206. The second stage 216 includes a second bipolar transistor Q2 232, a second resistor R2 236 and a fourth resistor R4 234. An emitter of the second bipolar transistor Q2 232 is coupled to the drain of the second alpha transistor T2a 212 in the first current mirror circuit 206. The base of the second bipolar transistor Q2 232 is coupled to the amplifier 240. A first end of the second resistor R2 236 is coupled to a collector of the second bipolar transistor Q2 232, and a second end of the second resistor R2 236 is coupled to the amplifier 240. A first end of the fourth resistor R4 234 is coupled to the drain of the second alpha transistor T2a 212, and a second end of the fourth resistor R4 234 is coupled to the amplifier 240.

The amplifier 240 includes a first input terminal 240a, a second input terminal 240b and an output terminal. The first input terminal 240a of the amplifier 240 is coupled to the first stage 214, and the second input terminal 240b of the amplifier 240 is coupled to the second stage 216. The first input terminal 240a of the amplifier 240 is coupled to the first resistor R1 226 and the third resistor R3 224. The second input terminal 240b of the amplifier 240 is coupled to the second resistor R2 236, the fourth resistor R4 234 and the base of the second bipolar transistor Q2 232. The output terminal of the amplifier 240 is coupled to the second current mirror circuit 242.

The second current mirror circuit 242 is coupled to the first stage 214, the second stage 216 and the amplifier 240. The second current mirror circuit 242 includes a third alpha transistor T3a 244 and a fourth alpha transistor T4a 246. A source of the third alpha transistor T3a 244 is coupled to a ground terminal, and the drain of the third alpha transistor T3a 244 is coupled to the first input terminal 240a of the amplifier 240.

A source of the fourth alpha transistor T4a 246 is coupled to the ground terminal, and the drain of the fourth alpha transistor T4a 246 is coupled to the second input terminal 240b of the amplifier 240. Respective gates of the third alpha transistor T3a 244 and the fourth alpha transistor T4a 246 are coupled to the output terminal of the amplifier 240. In one example, when a transistor in the circuit 200 is a field effect transistor (FET), a source of a transistor is a first terminal, a drain is a second terminal, and a gate is a third terminal. In another example, when a transistor in the circuit 200 is a bipolar junction transistor (BJT), an emitter of a transistor is a first terminal, a collector is a second terminal, and a base is a third terminal.

The start-up circuit 260 is coupled to the output terminal of the amplifier 240. The start-up circuit 260 includes a first switch S1 262, a second switch S2 264, a first beta current mirror circuit 252, a source-follower circuit 254, a second beta current mirror circuit 256, a crude bandgap generator 270 and a signal generator 290. The first beta current mirror circuit 252 is coupled to the power input terminal Vdd 202.

The first beta current mirror circuit 252 includes a first beta transistor T1b 252a and a second beta transistor T2b 252b. A source of the first beta transistor T1b 252a is coupled to the power input terminal Vdd 202, and a drain of the first beta transistor T1b 252a is coupled to the source-follower circuit 254. A source of the second beta transistor T2b 252b is coupled to the power input terminal Vdd 202, and a drain of the second beta transistor T2b 252b is coupled to the second beta current mirror circuit 256. A gate of the second beta transistor T2b 252b is coupled to the drain of the second beta transistor T2b 252b and to a gate of the first beta transistor T1b 252a.

The source-follower circuit 254 is coupled to the first switch S1 262, the second switch S2 264 and the first beta current mirror circuit 252. The source-follower circuit 254 includes a third beta transistor T3b 254a and a fourth beta transistor T4b 254b. A source of the third beta transistor T3b 254a is coupled to the second current mirror circuit 242, and a drain of the third beta transistor T3b 254a is coupled to the first switch S1 262. A source of the fourth beta transistor T4b 254b is coupled to a seventh beta transistor T7b 258, and a drain of the fourth beta transistor T4b 254b is coupled to the first beta current mirror circuit 252. A gate of the fourth beta transistor T4b 254b is coupled to the drain of the fourth beta transistor T4b 254b and to a gate of the third beta transistor T3b 254a. A source of the seventh beta transistor T7b 258 is coupled to the ground terminal, and a drain of the seventh beta transistor T7b 258 is coupled to the fourth beta transistor T4b 254b and to the gate of the seventh beta transistor T7b 258.

The second beta current mirror circuit 256 is coupled to the first beta current mirror circuit 252. The second beta current mirror circuit 256 includes a fifth beta transistor T5b 256a and a sixth beta transistor T6b 256b. A source of the fifth beta transistor T5b 256a is coupled to the ground terminal, and a drain of the fifth beta transistor T5b 256a is coupled to the first beta current mirror circuit 252. A source of the sixth beta transistor T6b 256b is coupled to the ground terminal, and the drain of the sixth beta transistor T6b 256b is coupled to the crude bandgap generator 270. A gate of the sixth beta transistor T6b 256b is coupled to the drain of the sixth beta transistor T6b 256b and to a gate of the fifth beta transistor T5b 256a.

The crude bandgap generator 270 is coupled to the power input terminal Vdd 202 and to the second beta current mirror circuit 256. The crude bandgap generator includes a third bipolar transistor Q3 274, a fourth bipolar transistor Q4 272, a fifth bipolar transistor Q5 276, a sixth bipolar transistor Q6 266, a seventh bipolar transistor Q7 294, a third switch S3 298, a fifth resistor R5 278, a sixth resistor R6 280, a seventh resistor R7 282, an eighth resistor R8 268 and a ninth resistor R9 296. An emitter of the third bipolar transistor Q3 274 is coupled to the power input terminal Vdd 202, and a collector of the third bipolar transistor Q3 274 is coupled to a first end of the sixth resistor R6 280 and to a base of the third bipolar transistor Q3 274.

An emitter of the fourth bipolar transistor Q4 272 is coupled to the power input terminal Vdd 202, and a collector of the fourth bipolar transistor Q4 272 is coupled to a first end of a seventh resistor R7 282. A base of the fourth bipolar transistor Q4 272 is coupled to a second end of the sixth resistor R6 280. A first end of the fifth resistor R5 278 is coupled to the power input terminal Vdd 202. An emitter of the fifth bipolar transistor Q5 276 is coupled to respective second ends of the fifth resistor R5 278 and of the sixth resistor R6 280. A collector of the fifth bipolar transistor Q5 276 is coupled to the second beta current mirror circuit 256. A first end of the seventh resistor R7 282 is coupled to the collector of the fourth bipolar transistor Q4 272 and to the base of the fifth bipolar transistor Q5 276. A second end of the seventh resistor R7 282 is coupled to one end of the third switch S3 298. A second end of the third switch S3 298 is coupled to the ground terminal. A first end of the eighth resistor R8 268 is coupled to the power input terminal Vdd 202. An emitter of the sixth bipolar transistor Q6 266 is coupled to a second end of the eighth resistor R8 268. A collector of the sixth bipolar transistor Q6 266 is coupled to the signal generator 290. A base of sixth bipolar transistor Q6 266 is coupled to one end of the ninth resistor R9 296. A second end of the ninth resistor R9 296 is coupled to the ground terminal. An emitter of the seventh bipolar transistor Q7 294 is coupled to the power input terminal Vdd 202, and a collector of the seventh bipolar transistor Q7 294 is coupled to the first end of the ninth resistor R9 296. A base of the seventh bipolar transistor Q7 294 is coupled to a second end of the eighth resistor R8 268.

The signal generator 290 is coupled to the crude bandgap generator 270. The signal generator 290 includes a logic gate 284, an eighth beta transistor T8b 286 and a ninth beta transistor T9b 288. The logic gate 284 is coupled to the crude bandgap generator 270. In one example, the logic gate 284 is a comparator. In another example, the logic gate 284 is an inverter. A drain of the eighth beta transistor T8b 286 is coupled to the crude bandgap generator 270 and to the logic gate 284. A gate of the eighth beta transistor T8b 286 receives a bandgap voltage Vbg 220. A voltage across the bandgap resistor Rbg 218 is the bandgap voltage Vbg 220. A source of the ninth beta transistor T9b 288 is coupled to the ground terminal, and a gate of the ninth beta transistor T9b 288 receives an output voltage Vo 250. A voltage at the output terminal of the amplifier 240 is the output voltage Vo 250. A drain of the ninth beta transistor T9b 288 is coupled to a source of the eighth beta transistor T8b 286.

The circuit 200 may include one or more conventional components that are not described herein for brevity. Each component of the circuit 200 may also be coupled to other components or blocks in FIG. 2, but those connections are not described herein for brevity. Also, each block or component of FIG. 2 may be coupled to conventional components of a system using the circuit 200, which are also not shown in FIG. 2 for brevity.

In operation, the amplifier 240 generates the output voltage Vo 250 at its output terminal. The output voltage Vo 250 controls the second current mirror circuit 242. The base of the second bipolar transistor Q2 232 is coupled to its collector with the second resistor R2 236. In one example, a width of the fourth alpha transistor T4a 246 is "m" times a width of the third alpha transistor T3a 244. In another example, a resistance of the second resistor R2 236 is "m" times smaller than a resistance of the first resistor R1 226. In one another example, a resistance of the fourth resistor R4 234 is "m" times smaller than a resistance of the third resistor R3 224. In one version, a value of m is 1. In yet another example, an area of the first bipolar transistor Q1 222 is "p" times area of the second bipolar transistor Q2 232.

A voltage across the second resistor R2 236 is a second reference voltage (ΔVBE). The second reference voltage (ΔVBE) is a difference in a base-to-emitter voltage of the second bipolar transistor Q2 232 in the second stage 216 and a base-to-emitter voltage of the first bipolar transistor Q1 222 in the first stage 214. In one example, the second reference voltage (ΔVBE) is expressed as:

$$\Delta VBE = Vk * \ln(m*p) \quad (2)$$

and Vk=KT/q, where K is Boltzmann constant, q is electron charge and T is absolute temperature.

A current through the second resistor R2 236 is a second reference current (I2) expressed as:

$$I2 = \frac{\Delta VBE}{R2} \quad (3)$$

A current through the fourth resistor R4 234 is a fourth reference current (I4) expressed as:

$$I4 = \frac{VBE2}{R4} \quad (4)$$

where VBE2 is base-to-emitter voltage of the second bipolar transistor Q2 232.

A sixth reference current (I6) drawn by the fourth alpha transistor T4a 246 is a sum of the second reference current (I2) and the fourth reference current (I4), and is expressed as:

$$I6 = \frac{\Delta VBE}{R2} + \frac{VBE2}{R4} \quad (5)$$

Amplifier 240 is closed loop, which ensures that the first input terminal 240a and the second input terminal 240b are maintained at same level. A current through the third resistor R3 224 is a third reference current (I3) expressed as:

$$I3 = \frac{VBE2}{R3} \quad (6)$$

Due to current mirroring, a fifth reference current (I5) drawn by the third alpha transistor T3a 244 is expressed as:

$$I5=I6/(m) \quad (7)$$

A current through the first resistor R1 226 is a first reference current (I1) expressed as:

$$I1=I5-I3 \quad (8)$$

A voltage drop across the first resistor R1 226 ensures that voltages at respective collectors of the first bipolar transistor Q1 222 and the second bipolar transistor Q2 232 are substantially equal. Thus, equations (5) and (7) can be expressed as:

$$I5 = \frac{Vk * \ln(m*p)}{R1} + \frac{VBE2}{R3} \quad (9)$$

$$I6 = \frac{Vk * \ln(m*p)*m}{R1} + \frac{VBE2*m}{R3} \quad (10)$$

Thus, a current through the second alpha transistor T2a 212 is an averaged current (or bandgap current Ibg) and, in one example, the averaged current is a sum of the fifth reference current (I5) and the sixth reference current (I6). In another example, the averaged current is a function of the fifth reference current (I5) and the sixth reference current (I6). The averaged current is mirrored to the first alpha transistor T1a 210. The averaged current (or bandgap current Ibg) is provided to the bandgap resistor Rbg 218 to generate the bandgap voltage Vbg 220. The averaged current (or bandgap current Ibg) ensures that mismatch between the third alpha transistor T3a 244 and the fourth alpha transistor T4a 246 has minimal or no impact on the bandgap voltage Vbg 220.

When the second reference voltage (ΔVBE) is less than an operating threshold, a bias current (or a current at a base) of the second bipolar transistor Q2 232 is less than an operating point. The operating point is a point (e.g., for a given set of selected values of components of a circuit) at which a stable bandgap voltage Vbg 220 is maintained by the circuit 200. A valid (e.g., correct) operating point is a point at which the circuit 200 operates in accordance with its specified function. The operating threshold and the operating point are directly correlated. As a result of the bias current being less than the operating point, the first reference current (I1) through the first resistor R1 226 increases. This increases a current at the first input terminal 240a of the amplifier 240, and it increases the output voltage Vo 250 from the amplifier 240. The amplifier 240 controls the second current mirror circuit 242, which increases the second reference current (I2) through the second resistor R2 236. The second reference current (I2) attains a substantially constant value when the second reference voltage (ΔVBE) is substantially equal to the operating threshold.

When the second reference voltage (ΔVBE) is greater than an operating threshold, the bias current (or a current at a base) of the second bipolar transistor Q2 232 is greater than the operating point. The operating threshold and the operating point are directly correlated. As a result of the bias current being greater than the operating point, the first reference current (I1) through the first resistor R1 226 reduces. This reduces a current at the first input terminal 240a of the amplifier 240, and it reduces the output voltage Vo 250 from the amplifier 240. The amplifier 240 controls the second current mirror circuit 242, which reduces the second reference current (I2) through the second resistor R2 236. The second reference current (I2) attains a substantially constant value when the second reference voltage (ΔVBE) is substantially equal to the operating threshold.

The coupling of the base of the first bipolar transistor Q1 222 to the collector of the second bipolar transistor Q2 232, and the coupling of the second resistor R2 236 between the base and collector of the second bipolar transistor Q2 232, ensures that the bandgap voltage Vbg 220 is not impacted by an offset associated with the amplifier 240. The first resistor R1 226 ensures that respective collector voltages of the first bipolar transistor Q1 222 and the second bipolar transistor Q2 232 are substantially equal, so the currents associated with the first bipolar transistor Q1 222 and the second bipolar transistor Q2 232 are not dependent on finite output impedances associated with the first bipolar transistor Q1 222 and the second bipolar transistor Q2 232.

The start-up circuit 260 ensures that the circuit 200 has a correct operating point in a steady state. In the crude bandgap generator 270, the third bipolar transistor Q3 274 is matched to the fourth bipolar transistor Q4 272. In one example, size of the third bipolar transistor Q3 274 is greater than size of the fourth bipolar transistor Q4 272. As a result, a voltage (ΔVBE43) across the sixth resistor R6 280 is equal to a difference in respective base-emitter voltages of the fourth bipolar transistor Q4 272 and the third bipolar transistor Q3 274. When a power supply voltage is provided at the power input terminal Vdd 202 of the circuit 200, a voltage across the sixth resistor R6 280 is ΔVBE43. In one example, a current through the sixth resistor R6 280 is proportional to ΔVBE43/R6. A voltage across the fifth resistor R5 278 is VBE4 (base-emitter voltage of the fourth bipolar transistor Q4 272). In one example, a current through the fifth resistor R5 278 is proportional to ΔVBE4/R5. A current through the collector of the fifth bipolar transistor Q5 276 is a sum of current through the fifth resistor R5 278 and current through the sixth resistor R6 280. This current is start-up current. The sixth bipolar transistor Q6 266 and the seventh bipolar transistor Q7 294 form a closed loop, due to which a current (primary current Ip) at the collector of the sixth bipolar transistor Q6 266 is VBE7/R8. The crude bandgap generator 270 generates the primary current Ip and the start-up current (current at the collector of the fifth bipolar transistor Q5 276). A current through the eighth beta transistor T8b 286 is the averaged current (or bandgap current Ibg).

In one example, the logic gate 284 performs a comparison of the primary current Ip and the averaged current (or bandgap current Ibg). When the averaged current is less than the primary current Ip, the logic gate 284 generates an activation signal Vt 292 as a logic-low signal. In one example, the logic gate 284 is a comparator. In another example, the logic gate 284 is an inverter. The logic-low activation signal Vt 292 turns ON the first switch S1 262 and the third switch S3 298, and it turns OFF the second switch S2 264. This results in coupling of the power input terminal Vdd 202 to the source-follower circuit 254, and decoupling of the gate of the third beta transistor T3*b* 254*a* from the ground terminal.

The start-up current is mirrored by the second beta current mirror circuit 256 to the drain of the fifth beta transistor T5*b* 256*b*. In one example, a width of the sixth beta transistor T6*b* 256*b* is twice a width of the fifth beta transistor T5*b* 256*a*. Thus, the start-up current mirrored by the second beta current mirror circuit 256, in one example, is a fraction of the start-up current at the collector of the fifth bipolar transistor Q5 276. In another example, the start-up current mirrored by the second beta current mirror circuit 256 is same as the start-up current at the collector of the fifth bipolar transistor Q5 276.

The start-up current is then mirrored by the first beta current mirror circuit 252 to the drain of the first beta transistor T1*b* 252*a*. In one example, a width of the second beta transistor T2*b* 252*b* is 4 times a width of the first beta transistor T1*b* 252*a*. Thus, in one example, the start-up current mirrored by the first beta current mirror circuit 252 is a fraction of the start-up current at the drain of the second beta transistor T2*b* 252*b*. The source-follower circuit 254 receives the mirrored start-up current and generates a secondary current Is at the source of the third beta transistor T3*b* 254*a*. In one example, a width of the fourth beta transistor T4*b* 254*b* is equal to a width of the third beta transistor T3*b* 254*a*.

A secondary current Is at the source of the third beta transistor T3*b* 254*a* results from the mirroring of the start-up current by the second beta current mirror circuit 256, and the first beta current mirror circuit 252, and providing the mirrored current to the source-follower circuit 254. The secondary current Is is provided to the output terminal of the amplifier 240. The output terminal of the amplifier 240 is a slowest node in the circuit 200 (due to high input impedance of the amplifier 240 and also due to gate capacitances associated with the third alpha transistor T3*a* 244 and the fourth alpha transistor T4*a* 246). Accordingly, in order to settle the circuit 200 to correct operating point, the output terminal of the amplifier 240 is quickly charged by the secondary current Is. The seventh beta transistor T7*b* 258 is replica biased with respect to the fourth alpha transistor T4*a* 246 (or the third alpha transistor T3*a* 244). Thus, the seventh beta transistor T7*b* 258 and the fourth alpha transistor T4*a* 246 have a same current density, and a voltage at the gate of the seventh beta transistor T7*b* 258 is equal to a voltage at the gate of the fourth beta transistor T4*b* 254*b*. This results in fast charging the output of the amplifier 240 to correct the operating point by the secondary current Is due to source follower action of the source-follower circuit 254. This also ensures that the circuit 200 avoids any overshoot or slow settling.

The charging of the output of amplifier 240 by the secondary current Is occurs until the output voltage Vo 250 is less than a gate-to-source voltage of the seventh beta transistor T7*b* 258. When the output voltage Vo 250 is equal to the gate-to-source voltage of the seventh beta transistor T7*b* 258, the primary current Ip becomes equal to the averaged current (or bandgap current Ibg), which causes the logic gate 284 to generate the activation signal Vt 292 as a logic-high signal. The logic-high activation signal Vt 292 turns OFF the first switch S1 262 and the third switch S3 298, and it turns ON the second switch S2 264. This causes decoupling of the power input terminal Vdd 202 from the source-follower circuit 254, and coupling of the gate of the third beta transistor T3*b* 254*a* to the ground terminal. This turns off the start-up circuit 260. Thus, the start-up circuit 260 provides fast start-up of the circuit 200 at the correct operating point, and turns off itself after performing start-up, and accordingly does not hinder the operation of the circuit 200 to generate a stable bandgap voltage Vbg 220.

Thus, the circuit 200 provides a stable bandgap voltage Vbg 220 over a wide power supply voltage range. In one example, the circuit 200 supports supply range from 2V to 6V, so the circuit 200 is useful in automotive applications, because of immunity against substrate noise and supply noise. Some automotive applications have high transients in power supply voltage, but the circuit 200 is insensitive to such power supply voltage transients. The circuit 200 effectively addresses the issues of current-mismatch by mirroring the averaged current through the diode-connected PFET T2*a* 212.

The circuit 200 significantly reduces the quiescent current, so the circuit 200 is useful in portable or battery powered circuits, because such circuits have a more stringent quiescent current specification along with requirements of low noise. The start-up circuit 260 provides fast start-up of the circuit 200 at the correct operating point. Also, the start-up circuit 260 is turned off when the activation signal Vt 292 is at logic high, which ensures zero impact on quiescent current. The replica biasing of the seventh beta transistor T7*b* 258 ensures that the circuit 200 settles at the correct operating point quickly, and also ensures that the circuit 200 avoids any overshoot or undershoot.

Applications such as environmental sensors and medical systems can use the circuit 200 as a bandgap reference circuit, because it provides an accurate bandgap voltage over a wide range of power supply voltages with low quiescent current and low noise, and accordingly increases accuracy of such systems.

Figure 3:
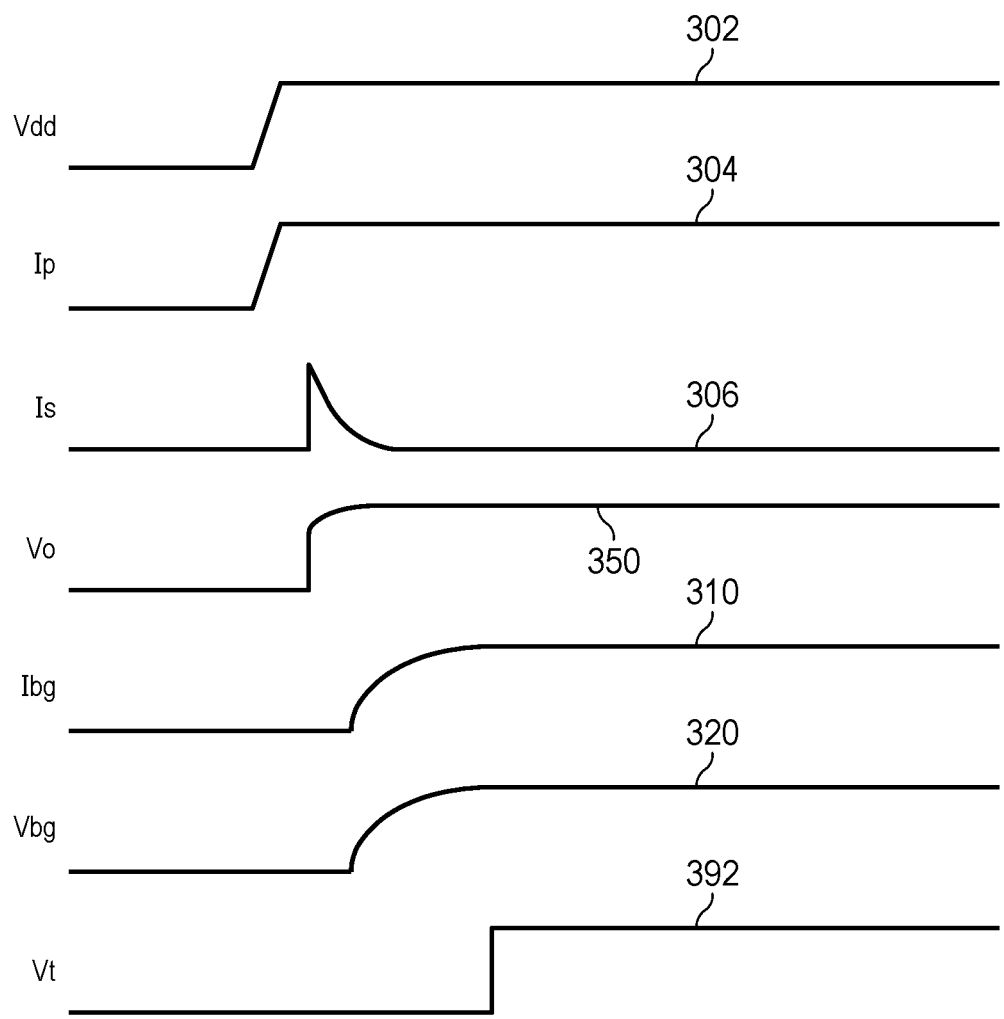
FIG. 3 is a waveform diagram of operation of the circuit of FIG. 2, according to an embodiment.

FIG. 3 is a waveform diagram of operation of the circuit 200 of FIG. 2, according to an embodiment. The waveform diagram is described in connection with the circuit 200 of FIG. 2. The waveform diagram illustrates a power supply voltage Vdd 302. The power supply voltage is provided at the power input terminal Vdd 202 of FIG. 2. At startup, when power supply voltage Vdd 302 is absent, a bandgap voltage Vbg 320 (similar to the bandgap voltage Vbg 220 in FIG. 2) is at logic low. Also, a bandgap current Ibg 310 (or the averaged current) is at logic low when the power supply voltage Vdd 302 is absent.

When the power supply voltage Vdd 302 transitions to logic high, the bandgap voltage Vbg 320 is still at logic low. The start-up circuit 260 provides quick start-up to the circuit 200. The crude bandgap generator 270 in the start-up circuit 260 generates the primary current Ip 304 and the start-up current. The logic gate 284 performs a comparison of the primary current Ip 304 and the averaged current (or bandgap current Ibg 310). When the bandgap current Ibg 310 is less than the primary current Ip 304, the logic gate 284 generates an activation signal Vt 392 (similar to activation signal Vt 292 of FIG. 2) as a logic-low signal.

The start-up current is mirrored by the second beta current mirror circuit 256 and the first beta current mirror circuit 252, and the mirrored current is provided to the source-follower circuit 254 to generate a secondary current Is 306 at the source of the third beta transistor T3*b* 254*a*. The secondary current Is 306 is provided to the output terminal of the amplifier 240. The output terminal of the amplifier 240 is a slowest node in the circuit 200. Accordingly, in order to settle the circuit 200 to correct operating point, the output terminal of the amplifier 240 is quickly charged by the secondary current Is 306. As illustrated in FIG. 3, the secondary current Is 306 is a spiked current for a very short duration to quickly charge the output of the amplifier 240.

The charging of the output of the amplifier 240 increases the bandgap current Ibg 310 (or averaged current). The bandgap current Ibg 310 through the bandgap resistor Rbg 218 results in the bandgap voltage Vbg 320 (similar to bandgap voltage Vbg 220 in FIG. 2). After the bandgap current Ibg 310 is greater than the primary current Ip 304, the logic gate 284 generates the activation signal Vt 392 (similar to activation signal Vt 292 of FIG. 2) as a logic-high signal. The logic-high activation signal Vt 392 turns OFF the first switch S1 262 and the third switch S3 298, and it turns ON the second switch S2 264. This turns off the start-up circuit 260. Thus, the start-up circuit 260 provides fast start-up of the circuit 200 at the correct operating point, and turns off itself after performing start-up, and accordingly does not hinder the operation of the circuit 200 to generate a stable bandgap voltage Vbg 320.

Thus, the circuit 200 provides a stable bandgap voltage Vbg 220 over a wide power supply voltage range. In one example, the circuit 200 supports a power supply voltage range from 2V to 6V. The circuit 200 significantly reduces the quiescent current, so the circuit 200 is useful in portable or battery powered circuits, because such circuits have more stringent quiescent current specification along with requirements of low noise. The start-up circuit 260 provides fast start-up of the circuit 200 at the correct operating point. Also, the start-up circuit 260 is turned off when the activation signal Vt 392 is at logic high, which ensures zero impact on quiescent current.

Figure 4:
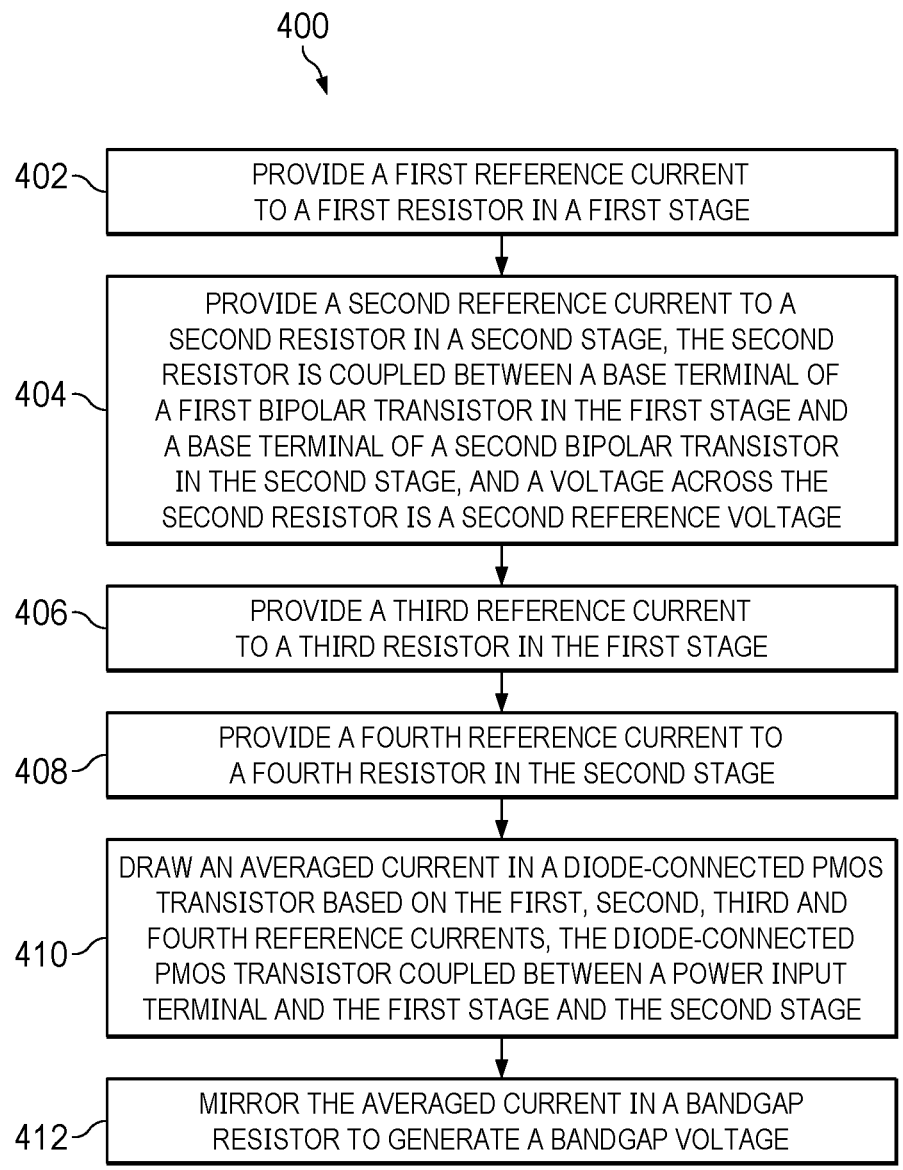
FIG. 4 is a flowchart of a method of operation of a circuit, according to an embodiment.

FIG. 4 is a flowchart of a method of operation of a circuit, according to an embodiment. The flowchart 400 is described in connection with the circuit 200 of FIG. 2. The flowchart starts at step 402 and ends at step 412. At step 402, a first reference current is provided to a first resistor in a first stage. In circuit 200, for example, a current through the first resistor R1 226 is a first reference current (I1), and is expressed as equation (8). In circuit 200, the first stage 214 is coupled to the first current mirror circuit 206, which is coupled to the power input terminal Vdd 202. The first stage 214 includes a first bipolar transistor Q1 222, a first resistor R1 226 and a third resistor R3 224. An emitter of the first bipolar transistor Q1 222 is coupled to the drain of the second alpha transistor T2a 212 in the first current mirror circuit 206. A base of the first bipolar transistor Q1 222 is coupled to the second stage 216. A first end of the first resistor R1 226 is coupled to a collector of the first bipolar transistor Q1 222, and a second end of the first resistor R1 226 is coupled to the amplifier 240. A first end of the third resistor R3 224 is coupled to the drain of the second alpha transistor T2a 212, and a second end of the third resistor R3 224 is coupled to the amplifier 240.

At step 404, a second reference current is provided to a second resistor in a second stage. The second resistor is coupled between a base of a first bipolar transistor in the first stage and a base of a second bipolar transistor in the second stage, and a voltage across the second resistor is a second reference voltage. In circuit 200, a current through the second resistor R2 236 is a second reference current (I2), and is expressed as equation (3). In circuit 200, the second stage 216 is coupled to the first stage 214 and to the first current mirror circuit 206. The second stage 216 includes a second bipolar transistor Q2 232, a second resistor R2 236 and a fourth resistor R4 234. An emitter of the second bipolar transistor Q2 232 is coupled to the drain of the second alpha transistor T2a 212 in the first current mirror circuit 206. The base of the second bipolar transistor Q2 232 is coupled to the amplifier 240. A first end of the second resistor R2 236 is coupled to a collector of the second bipolar transistor Q2 232, and a second end of the second resistor R2 236 is coupled to the amplifier 240. A first end of the fourth resistor R4 234 is coupled to the drain of the second alpha transistor T2a 212, and a second end of the fourth resistor R4 234 is coupled to the amplifier 240.

At step 406, a third reference current is provided to a third resistor in the first stage. At step 408, a fourth reference current is provided to a fourth resistor in the second stage. In circuit 200, a current through the third resistor R3 224 is a third reference current (I3), and is expressed as equation (6). A current through the fourth resistor R4 234 is a fourth reference current (I4), and is expressed as equation (4).

At step 410, an averaged current is drawn in a diode-connected PFET based on the first, second, third and fourth reference currents. The diode-connected PFET is coupled between a power input terminal and the first stage and the second stage. In circuit 200, the first current mirror circuit 206 includes a first alpha transistor T1a 210 and a second alpha transistor T2a 212. In one example, the second alpha transistor T2a 212 is a diode-connected PFET. The second alpha transistor T2a 212 is coupled to the first stage 214 and the second stage 216. The current through the second alpha transistor T2a 212 is an averaged current (or bandgap current Ibg) and, in one example, the averaged current is a sum of the first reference current (I1), the second reference current (I2), the third reference current (I3) and the fourth reference current (I4).

At step 412, the averaged current is mirrored in a bandgap resistor to generate a bandgap voltage. In circuit 200, the averaged current is mirrored to the first alpha transistor T1a 210. The averaged current (or bandgap current Ibg) is provided to the bandgap resistor Rbg 218 to generate a bandgap voltage Vbg 220. The circuit 200 includes a start-up circuit 260, which ensures that the circuit 200 has a correct operating point at steady-state. The start-up circuit 260 includes a first switch S1 262, a second switch S2 264, a first beta current mirror circuit 252, a source-follower circuit 254, a second beta current mirror circuit 256, a crude bandgap generator 270 and a signal generator 290.

The crude bandgap generator 270 generates the primary current Ip and the start-up current. In one example, the logic gate 284 in the signal generator 290 performs a comparison of the primary current Ip and the averaged current (or bandgap current Ibg). When the averaged current is less than the primary current Ip, the logic gate 284 generates an activation signal Vt 292 as a logic-low signal. The logic-low activation signal Vt 292 turns ON the first switch S1 262 and the third switch S3 298, and it turns OFF the second switch S2 264. The start-up current is mirrored by the second beta current mirror circuit 256 and the first beta current mirror circuit 252, and the mirrored current is provided to the source-follower circuit 254 to generate a secondary current Is. The secondary current Is is provided to the output terminal of the amplifier 240. The secondary current Is provides fast charging to the output of the amplifier 240. This ensures that the circuit 200 settles at the correct operating point quickly, and also ensures that the circuit 200 avoids any overshoot or undershoot.

The method of flowchart 400 enables a circuit to provide a stable bandgap voltage Vbg over a wide power supply voltage range. In one example, the circuit 200 supports supply range from 2V to 6V. The circuit 200 significantly reduces the quiescent current, so the circuit 200 is useful in portable or battery powered circuits, because such circuits have more stringent quiescent current specification along with requirements of low noise. Applications such as environmental sensors and medical systems can use the method of flowchart 400 to provide an accurate bandgap voltage over a wide range of power supply voltages with low quiescent current and low noise, and accordingly increases accuracy of such systems.

Figure 5:
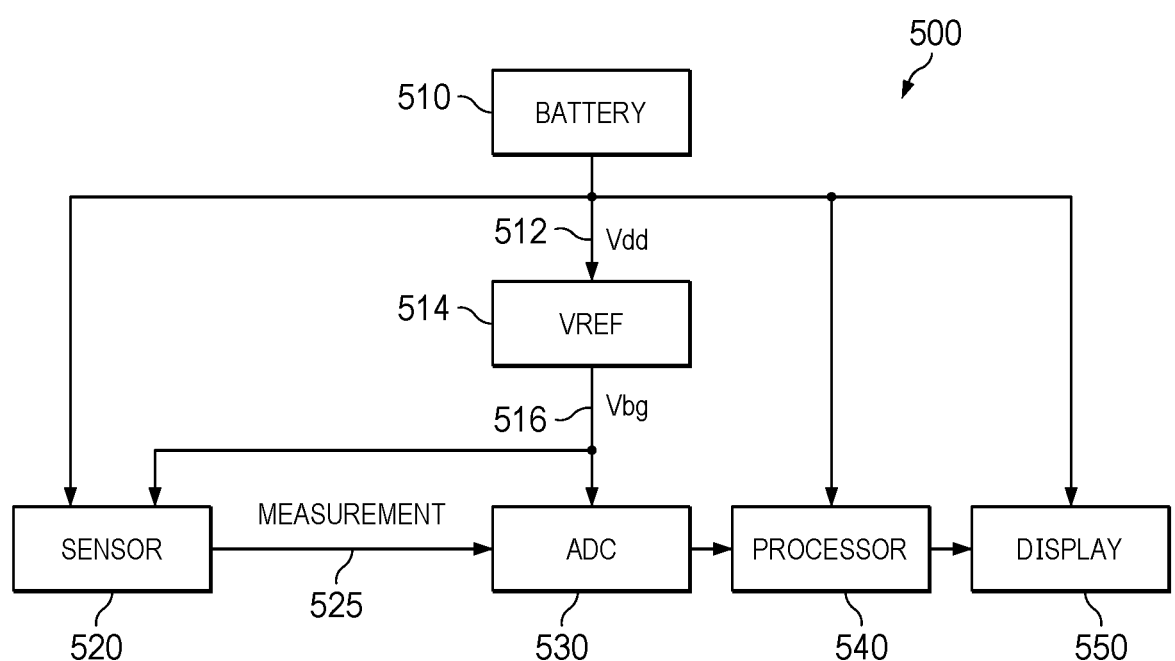
FIG. 5 is a block diagram of an example device in which several aspects of example embodiments can be implemented.

FIG. 5 is a block diagram of an example device 500 in which several aspects of example embodiments can be implemented. The device 500 is, or is incorporated into or is part of, a server farm, a vehicle, a communication device, a transceiver, a personal computer, a gaming platform, a computing device, any other type of electronic system, or a portable device such as a battery powered handheld measurement device. The device 500 may include one or more conventional components that are not described herein for brevity.

The device 500 includes a battery 510, a bandgap reference circuit Vref 514, a sensor 520, an analog-to-digital converter (ADC) 530, a processor 540 and a display 550. The processor 540 can be a CISC-type CPU (complex instruction set computing), a RISC-type CPU (reduced instruction set computing), a digital signal processor (DSP), a microprocessor, a CPLD (complex programmable logic device), or an FPGA (field programmable gate array). The battery 510 is configured to provide power supply voltage Vdd 512 to the bandgap reference circuit Vref 514, the sensor 520, the ADC 530, the processor 540 and the display 550.

The bandgap reference circuit Vref 514 is similar, in connection and operation, to the circuit 200 of FIG. 2. Similar to the circuit 200, the bandgap reference circuit Vref 514 includes a first current mirror circuit, a first stage, a second stage, an amplifier, a second current mirror circuit and a start-up circuit. A current through a first resistor in the first stage is a first reference current (I1). A current through a second resistor in the second stage is a second reference current (I2). A current through a third resistor in the first stage is a third reference current (I3). A current through the fourth resistor in the second stage is a fourth reference current (I4). An averaged current is drawn in a diode-connected PFET in the first current mirror circuit based on the first, second, third and fourth reference currents. The diode-connected PFET is coupled between a power input terminal and the first stage and the second stage. The averaged current (or bandgap current Ibg) is mirrored and provided to the bandgap resistor Rbg to generate a bandgap voltage Vbg 516.

The start-up circuit in the bandgap reference circuit Vref 514 includes a first switch S1, a second switch S2, a first beta current mirror circuit, a source-follower circuit, a second beta current mirror circuit, a crude bandgap generator and a signal generator. The crude bandgap generator generates the primary current Ip and the start-up current. In one example, a logic gate in the signal generator performs a comparison of the primary current Ip and the averaged current (or bandgap current Ibg). When the averaged current is less than the primary current Ip, the logic gate generates an activation signal Vt as a logic-low signal. The logic-low activation signal Vt turns ON the first switch S1 and the third switch S3 298, and it turns OFF the second switch S2. The start-up current is mirrored by the second beta current mirror circuit and the first beta current mirror circuit, and the mirrored current is provided to the source-follower circuit to generate a secondary current Is. The secondary current Is is provided to the output terminal of the amplifier. The secondary current Is provides fast charging to the output of the amplifier. This ensures that the bandgap reference circuit Vref 514 settles at the correct operating point quickly, and also ensures that the bandgap reference circuit Vref 514 avoids any overshoot or undershoot.

The bandgap reference circuit Vref 514 provides an accurate and stable bandgap voltage Vbg 516 for use by the sensor 520 and an ADC 530, which may be specified for small signal measurements. If the device 500 is handheld and battery powered, then the relatively low Iq provided by the bandgap reference circuit Vref 514 is also beneficial. The sensor 520 generates an analog measurement signal 525, which is converted into a digital signal by the ADC 530 to be supplied to the processor 540. The processor 540 may then manipulate the signal by performing any suitable signal processing functions, such as averaging, filtering, etc., and then provide results to be displayed on the display 550.

Figure 6:
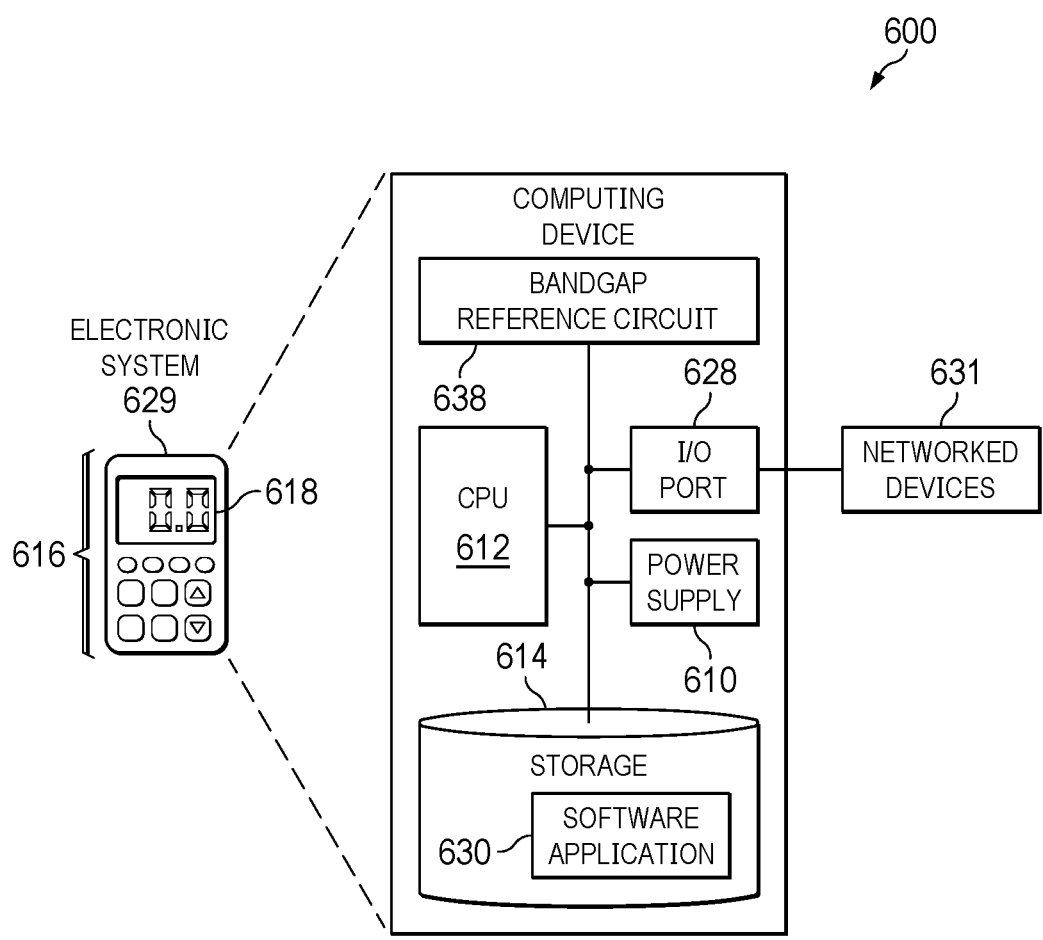
FIG. 6 illustrates a computing device in accordance with embodiments.

The bandgap reference circuit Vref 514 provides a stable bandgap voltage Vbg 516 over a wide power supply voltage range. Some applications have high transients in power supply voltage, but the bandgap reference circuit Vref 514 is insensitive to such power supply voltage transients. The bandgap reference circuit Vref 514 effectively addresses the issues of offset associated with the amplifier by mirroring the averaged current through the diode-connected PFET. The bandgap reference circuit Vref 514 provides an accurate bandgap voltage over a wide range of power supply voltages with low quiescent current and low noise FIG. 6 illustrates a computing device 600 in accordance with embodiments. For example, the computing device 600 is, or is incorporated into, or is coupled (e.g., connected) to an electronic system 629, such as a computer, electronics control "box" or display, communications equipment (including transmitters or receivers), or any type of electronic system operable to process information.

In some embodiments, the computing device 600 includes a megacell or a system-on-chip (SoC), which includes control logic such as a CPU 612 (central processing unit), a storage 614 (e.g., random access memory (RAM)) and a power supply 610. The CPU 612 can be, for example, a CISC-type (complex instruction set computing) CPU, RISC-type CPU (reduced instruction set computing), MCU-type (microcontroller unit), or a digital signal processor (DSP). The storage 614 (which can be memory such as on-processor cache, off-processor cache, RAM, flash memory, or disk storage) stores one or more software applications 630 (e.g., embedded applications) that, when executed by the CPU 612, perform any suitable function associated with the computing device 600.

The CPU 612 includes memory and logic that store information frequently accessed from the storage 614. The computing device 600 is often controlled by a user using a UI (user interface) 616, which provides information to and receives information from the user during the execution the software application 630. The information is provided to the user via the display 618, indicator lights, a speaker, vibrations, and the like. The information is received from the user via audio and/or video inputs (using, for example, voice or image recognition), and electrical and/or mechanical devices such as keypads, switches, proximity detectors, gyros, accelerometers, and the like.

The CPU 612 and the power supply 610 are coupled to I/O (input-output) port 628, which provides an interface configured to receive information from (and/or provide information to) networked devices 631. The networked devices 631 can include any device (such as test equipment) capable of point-to-point and/or networked communications with the computing device 600. The computing device 600 is often coupled to peripherals and/or computing devices, including tangible, non-transitory media (such as flash memory) and/or cabled or wireless media. These and other input and output devices are selectively coupled to the computing device 600 by external devices using wireless or cabled connections. The storage 614 is accessible, such as by the networked devices 631. The CPU 612, storage 614 and power supply 610 are also optionally coupled to an external power supply (not shown), which is configured to receive power from a power source (such as a battery, solar cell, "live" power cord, inductive field, fuel cell, capacitor, and the like).

The power supply 610 includes power generating and control components for generating power to enable the computing device 600 to execute the software application 630. In at least one example, the power supply 610 has one or more independently controllable power switches, each of which can supply power at various voltages to various components of the computing device 600. The power supply 610 is optionally in the same physical assembly as computing device 600, or is external to the computing device 600. The computing device 600 optionally operates in various power-saving modes (such as a sleep mode), so individual voltages are supplied (and/or turned off) according to a selected power-saving mode and the various components arranged within a specific power domain.

The computing device 600 includes a bandgap reference circuit 638. The bandgap reference circuit 638 is similar, in connection and operation, to the circuit 200 of FIG. 2. The bandgap reference circuit 638 is capable of working over a wide supply voltage range.

In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. A system comprising:
   a power supply terminal;
   a ground terminal;
   a first circuit coupled to the power supply terminal and the ground terminal, the first circuit including an amplifier having a first input terminal, a second input terminal, and an output terminal; and
   a second circuit including:
      a first transistor having a first terminal, a second terminal, and a control terminal, wherein the second terminal of the first transistor is coupled to the output terminal of the amplifier;
      a second transistor having a first terminal, a second terminal, and a control terminal, wherein the control terminal of the second transistor is coupled to the first terminal of the second transistor and the control terminal of the first transistor;
      a first switch having a first terminal and a second terminal, wherein the first terminal of the first switch is coupled to the power supply terminal, and the second terminal of the first switch is coupled to the first terminal of the first transistor; and
      a second switch having a first terminal and a second terminal, wherein the first terminal of the second switch is coupled to the control terminal of the first transistor and the control terminal of the second transistor, and a second terminal of the second switch is coupled to the ground terminal.

2. The system of claim 1, wherein:
   the first circuit further includes:
      a first current mirror circuit coupled to the power supply terminal;
      a first stage coupled to the first current mirror circuit;
      a second stage coupled to the first stage and to the first current mirror circuit; and
      a second current mirror circuit coupled to the first stage, the second stage, and the amplifier; and
   the ground terminal is coupled to the second current mirror circuit.

3. The system of claim 2, wherein:
   the first current mirror circuit includes:
      a third transistor having a first terminal, a second terminal coupled to the power supply terminal, and a control terminal; and
      a fourth transistor having a first terminal coupled to the control terminal of the third transistor, a second terminal coupled to the power supply terminal, and a control terminal coupled to the control terminal of the third transistor and the first terminal of the fourth transistor.

4. The system of claim 3, wherein:
   the first stage includes:
      a fifth transistor having a first terminal, a second terminal coupled to the first terminal of the fourth transistor, and a control terminal;
      a first resistor having a first terminal and a second terminal, the first terminal coupled to the first terminal of the fifth transistor; and
      a second resistor having a first terminal and a second terminal, the first terminal coupled to the second terminal of the fifth transistor, and the second terminal coupled to the second terminal of the first resistor.

5. The system of claim 4, wherein:
   the second stage includes:
      a sixth transistor having a first terminal coupled to the control terminal of the fifth transistor, a second terminal coupled to the first terminal of the fourth transistor, and a control terminal;
      a third resistor having a first terminal and a second terminal, the first terminal coupled to the first terminal of the sixth transistor; and
      a fourth resistor having a first terminal and a second terminal, the first terminal coupled to the second terminal of the sixth transistor, and the second terminal coupled to the second terminal of the third resistor.

6. The system of claim 5, wherein:
   the second terminal of the first resistor is coupled to the first input terminal of the amplifier; and
   the control terminal of the sixth transistor is coupled to the second input terminal of the amplifier.

7. The system of claim 6, wherein:
   the second current mirror circuit includes:
      a seventh transistor having a first terminal coupled to the first input terminal of the amplifier, and a second terminal coupled to the ground terminal; and
      an eighth transistor having a first terminal coupled to the second input terminal of the amplifier, and a second terminal coupled to the ground terminal.

8. The system of claim 7, wherein:
   a width of the eighth transistor is m times a width of the seventh transistor; and
   m equals 1.

9. The system of claim 7, wherein:
a resistance of the third resistor is m times smaller than a resistance of the first resistor; and
m equals 1.

10. The system of claim 7, wherein:
a resistance of the fourth resistor is m times smaller than a resistance of the second resistor; and
m equals 1.

11. The system of claim 7, wherein:
the second circuit includes a ninth transistor including a first terminal coupled to the second terminal of the second transistor, a second terminal coupled to the ground terminal, and a control terminal coupled to the first terminal of the ninth transistor.

12. The system of claim 11, wherein:
a current density of the ninth transistor is equal to a current density of the eighth transistor.

13. The system of claim 1, wherein:
the second circuit includes a first current mirror circuit, a second current mirror circuit, a bandgap generator circuit, and a signal generator circuit.

14. The system of claim 13, wherein:
the first current mirror circuit includes:
    a tenth transistor having a first terminal coupled to the control terminal of the first transistor, a second terminal coupled to the power supply terminal, and a control terminal; and
    an eleventh transistor having a first terminal coupled to the control terminal of the tenth transistor, a second terminal coupled to the power supply terminal, and a control terminal coupled to the first terminal of the eleventh transistor.

15. The system of claim 14, wherein:
the second current mirror circuit includes:
    a twelfth transistor having a first terminal coupled to the first terminal of the eleventh transistor, a second terminal coupled to the ground terminal, and a control terminal; and
    a thirteenth transistor having a first terminal, a second terminal coupled to the ground terminal, and a control terminal coupled to the control terminal of the twelfth transistor and the first terminal of the thirteenth transistor.

16. The system of claim 15, wherein:
the bandgap generator circuit includes:
    a fourteenth transistor having a first terminal, a second terminal coupled to the power supply terminal, and a control terminal coupled to the first terminal;
    a fifth resistor having a first terminal coupled to the power supply terminal, and a second terminal;
    a sixth resistor having a first terminal coupled to the first terminal of the fourteenth transistor, and a second terminal coupled to the second terminal of the fifth resistor;
    a fifteenth transistor having a first terminal, a second terminal coupled to the power supply terminal, and a control terminal coupled to the second terminal of the fifth resistor and the second terminal of the sixth resistor;
    a sixteenth transistor having a first terminal coupled to the control terminal of the thirteenth transistor, a second terminal coupled to the second terminal of the fifth resistor, and a control terminal coupled to the first terminal of the fifteenth transistor; and
    a seventh resistor having a first terminal coupled to the control terminal of the sixteenth transistor.

17. The system of claim 16, wherein:
the bandgap generator circuit includes:
    a seventeenth transistor having a first terminal, a second terminal, and a control terminal;
    an eighth resistor having a first terminal coupled to the power supply terminal, and a second terminal coupled to the second terminal of the seventeenth transistor;
    a ninth resistor having a first terminal coupled to the control terminal of the seventeenth transistor; and
    a eighteenth transistor having a first terminal coupled to the control terminal of the seventeenth transistor, a second terminal coupled to the power supply terminal, and a control terminal coupled to the second terminal of the eighth resistor.

18. The system of claim 17, wherein:
the signal generator circuit includes:
    a logic gate having an input coupled to the first terminal of the seventeenth transistor;
    a nineteenth transistor having a first terminal coupled to the first terminal of the seventeenth transistor, a second terminal, and a control terminal; and
    a twentieth transistor having a first terminal coupled to the second terminal of the nineteenth transistor, a second terminal coupled to the ground terminal, and a control terminal.

19. The system of claim 17, wherein:
a size of the fourteenth transistor is greater than a size of the fifteenth transistor.

20. The system of claim 17, wherein:
the bandgap generator circuit includes a third switch having a first terminal coupled to the second terminal of the seventh resistor, and a second terminal coupled to the ground terminal.

* * * * *